United States Patent [19]
Geller

[11] Patent Number: 5,319,656
[45] Date of Patent: Jun. 7, 1994

[54] THERMAL CONTROL FOR LASER DIODE USED IN OUTSIDE PLANT COMMUNICATIONS TERMINAL

[75] Inventor: William L. Geller, Foster City, Calif.

[73] Assignee: Raynet Corporation, Menlo Park, Calif.

[21] Appl. No.: 927,383

[22] PCT Filed: Apr. 3, 1991

[86] PCT No.: PCT/US91/02304
§ 371 Date: Sep. 23, 1992
§ 102(e) Date: Sep. 23, 1992

[87] PCT Pub. No.: WO91/15886
PCT Pub. Date: Oct. 17, 1991

[51] Int. Cl.$^5$ .................................. H01S 3/00
[52] U.S. Cl. ........................ 372/38; 372/31; 359/164
[58] Field of Search ............. 372/38, 26, 31, 32; 455/613, 607

[56] References Cited

U.S. PATENT DOCUMENTS 4,689,795  8/1987  Yoshinoto et al. ............ 372/31
4,709,416  11/1987  Patterson ....................... 455/609

FOREIGN PATENT DOCUMENTS 0134960  3/1985  European Pat. Off. .
8809093  11/1988  PCT Int'l Appl. .

Primary Examiner—Leon Scott, Jr.
Attorney, Agent, or Firm—Herbert G. Burkard

[57] ABSTRACT

A method and apparatus implementing the method are provided for controlling optical power output level of a laser diode modulated during a burst mode interval by digital data transitions within a shared logical bus optical communications network and over a predetermined thermal gradient. The method comprises the steps of: optically monitoring a component of the optical output power of the laser diode during each burst mode interval and converting the component into a control signal, establishing a reference signal and comparing the control signal with the established reference signal and for providing a logical condition from said comparison, generating a strobe signal from information related in time to the burst mode interval, storing the logical condition upon receipt of the strobe signal, integrating the stored logical condition over a time period to provide an integrated control signal, and regulating current flow through the laser diode in accordance with the integrated control signal.

17 Claims, 11 Drawing Sheets

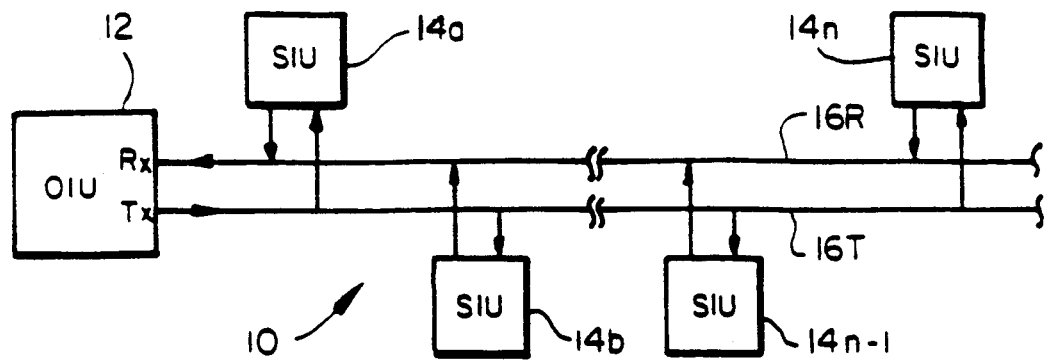
FIG_1
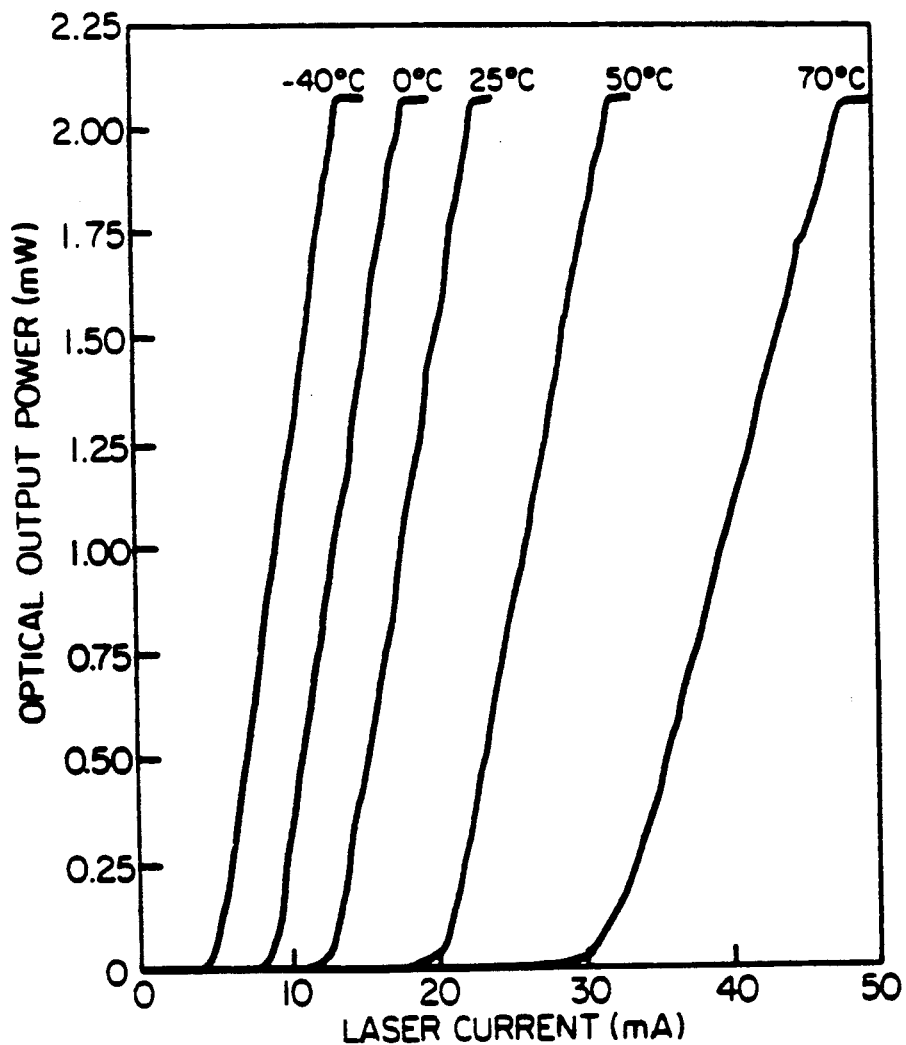
FIG_2

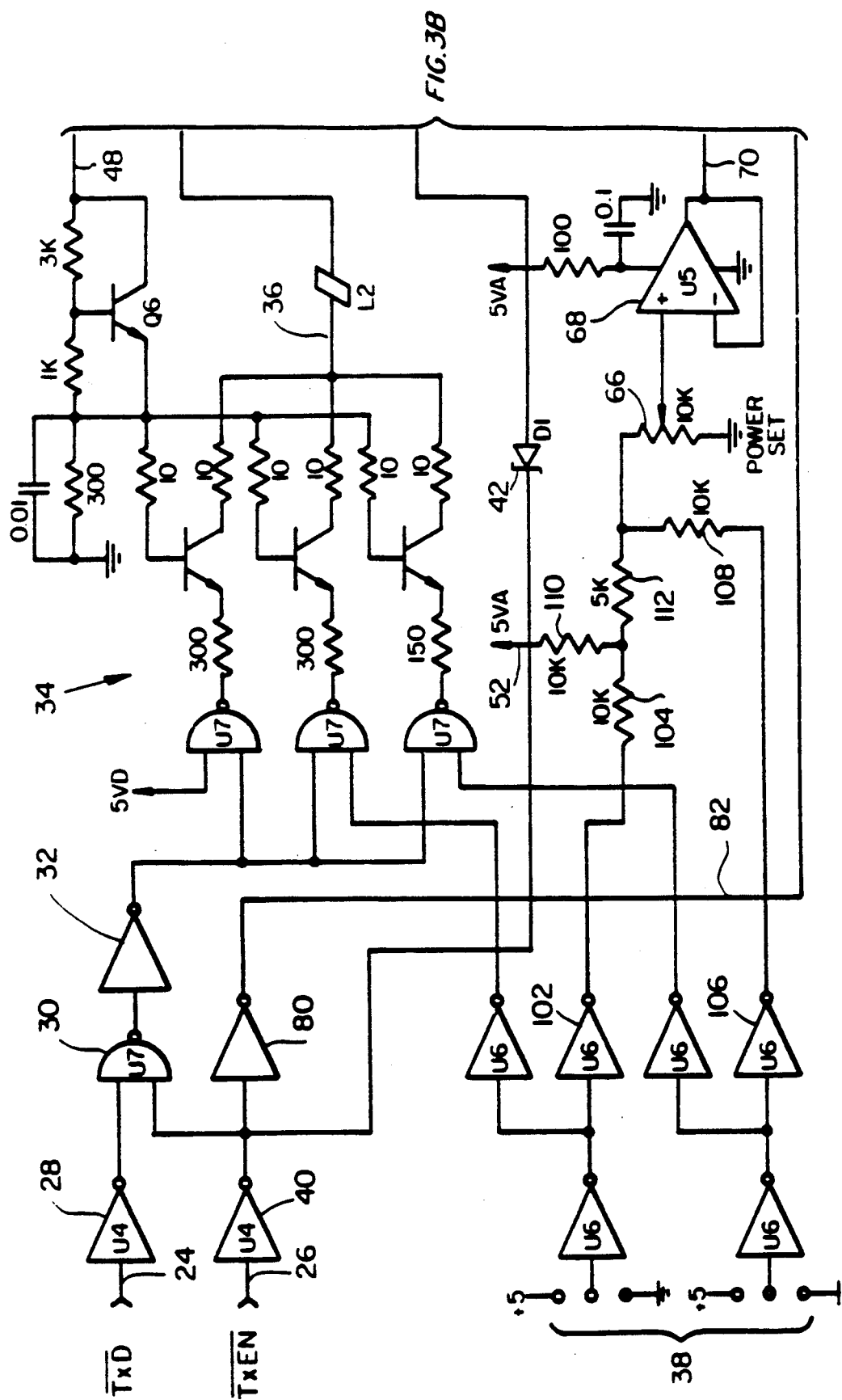
FIG_3A

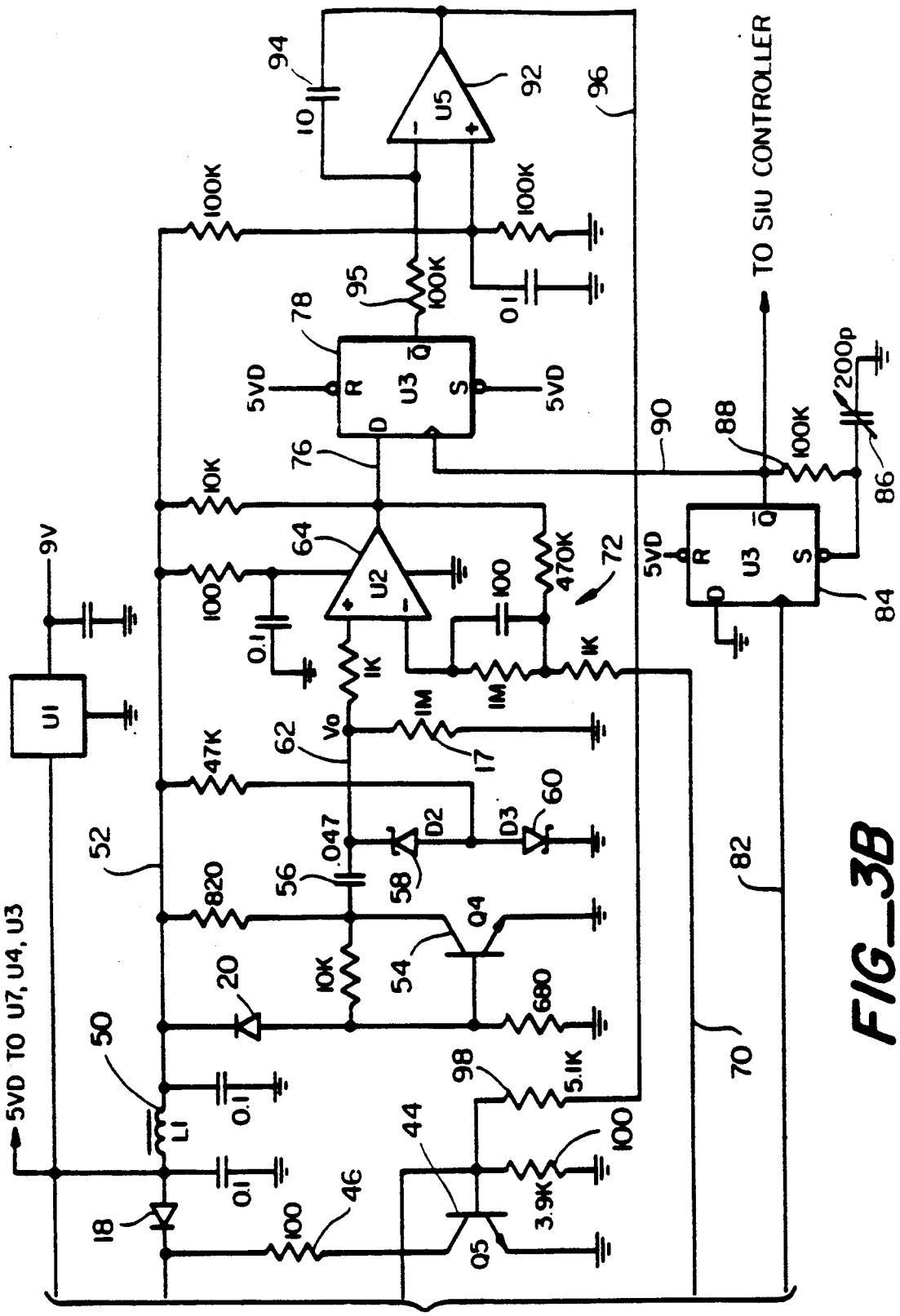

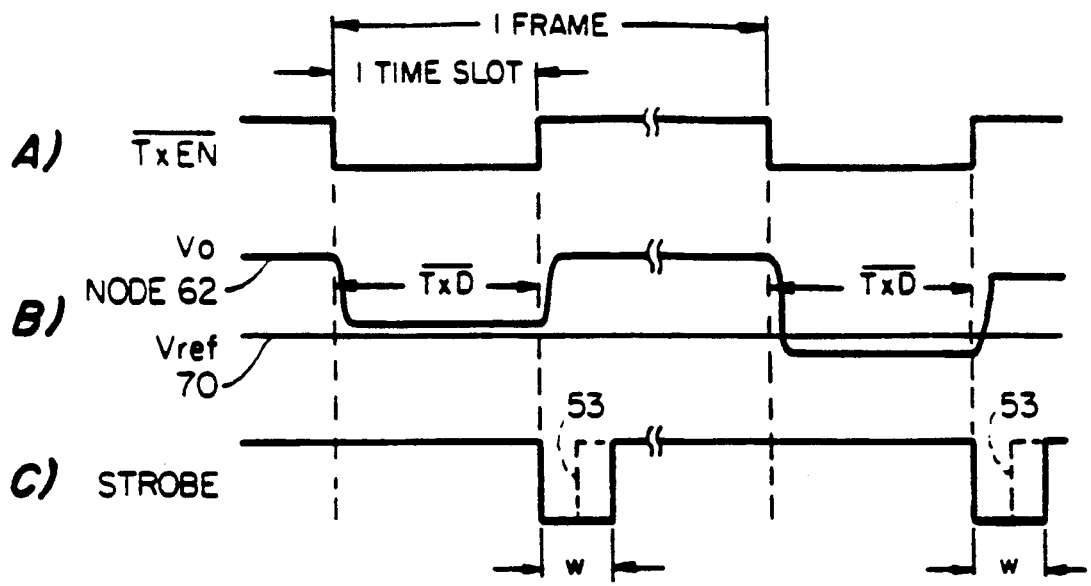
FIG_4
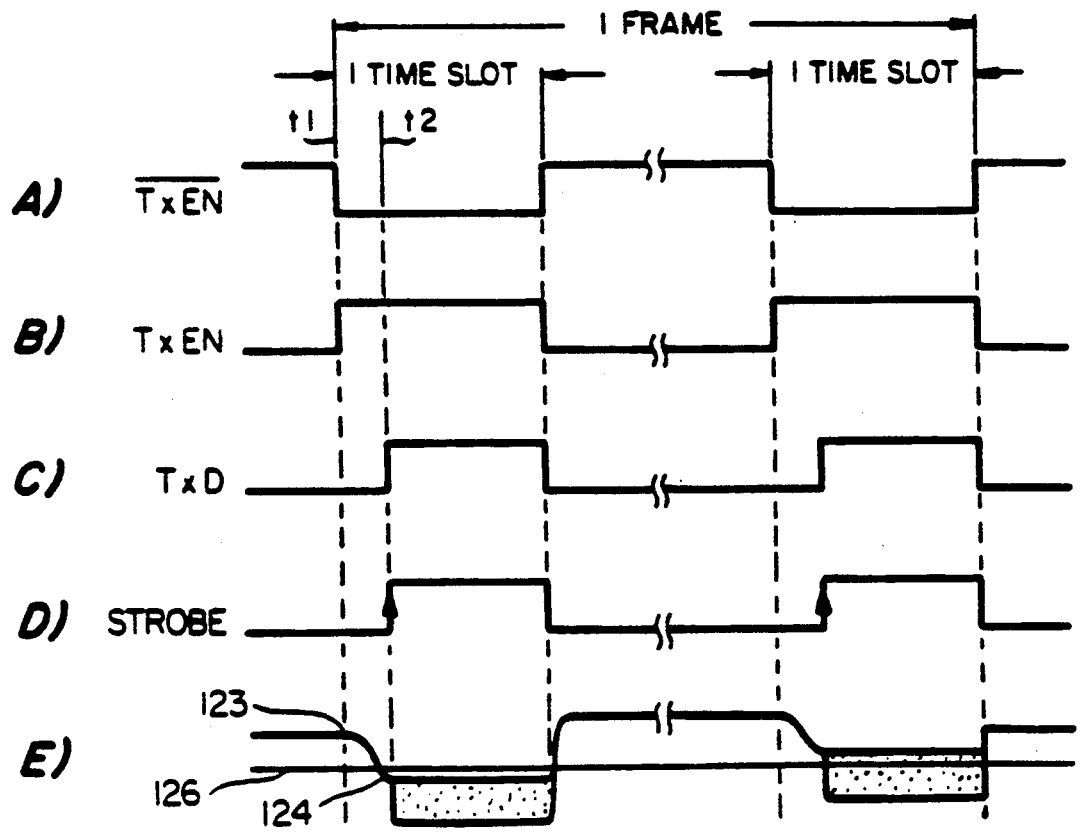
FIG_6

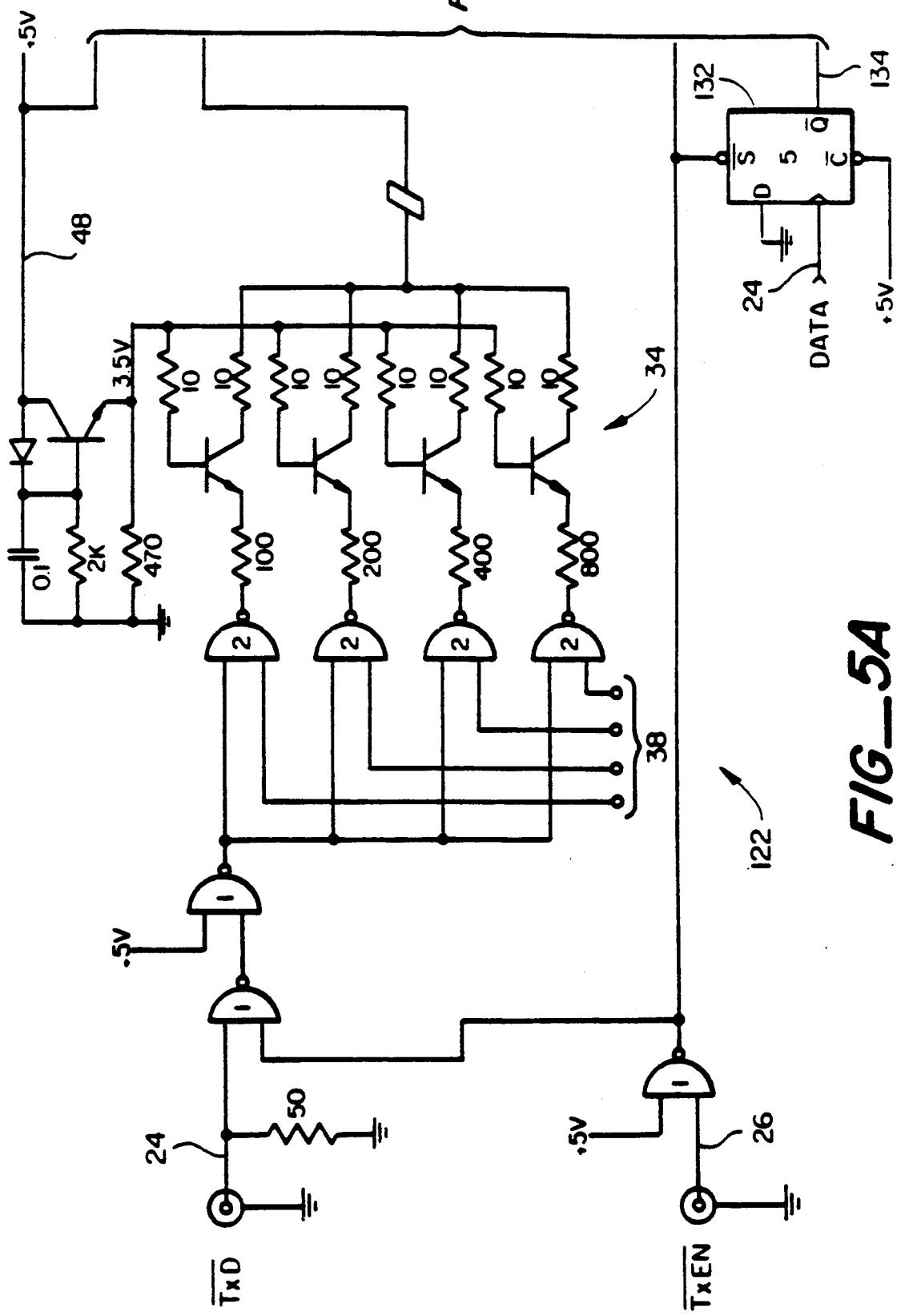
FIG._5A

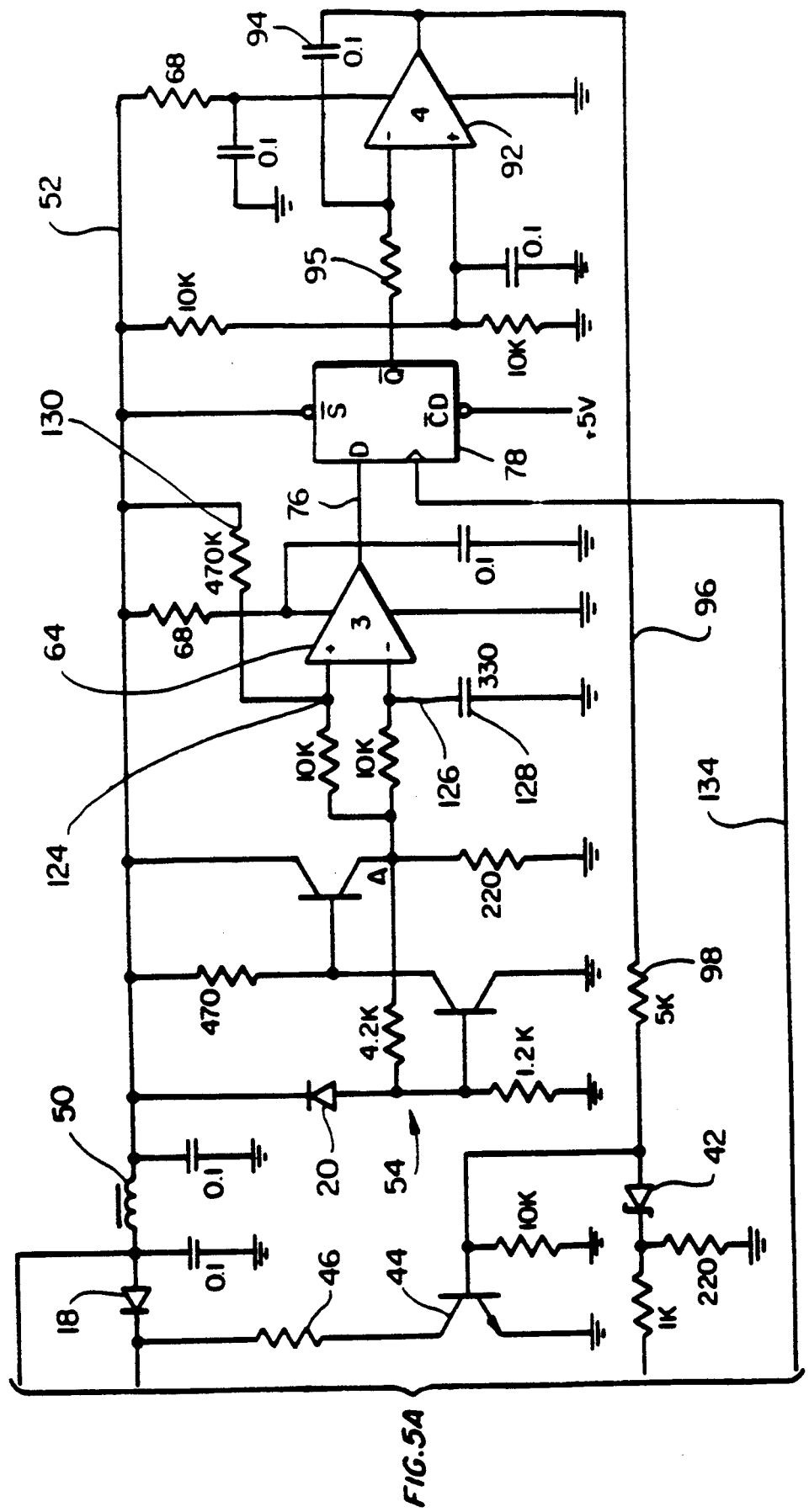

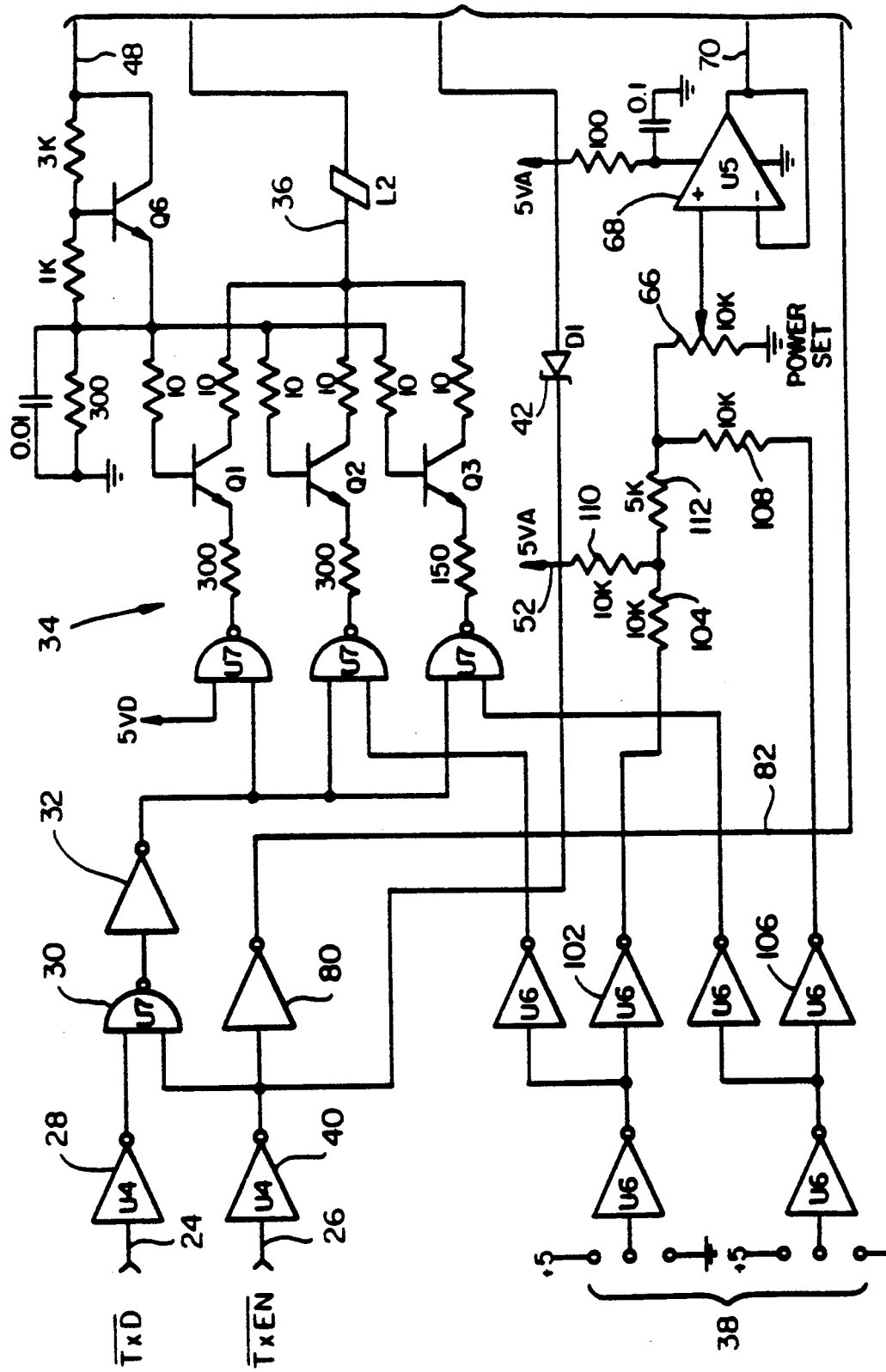
FIG_7A

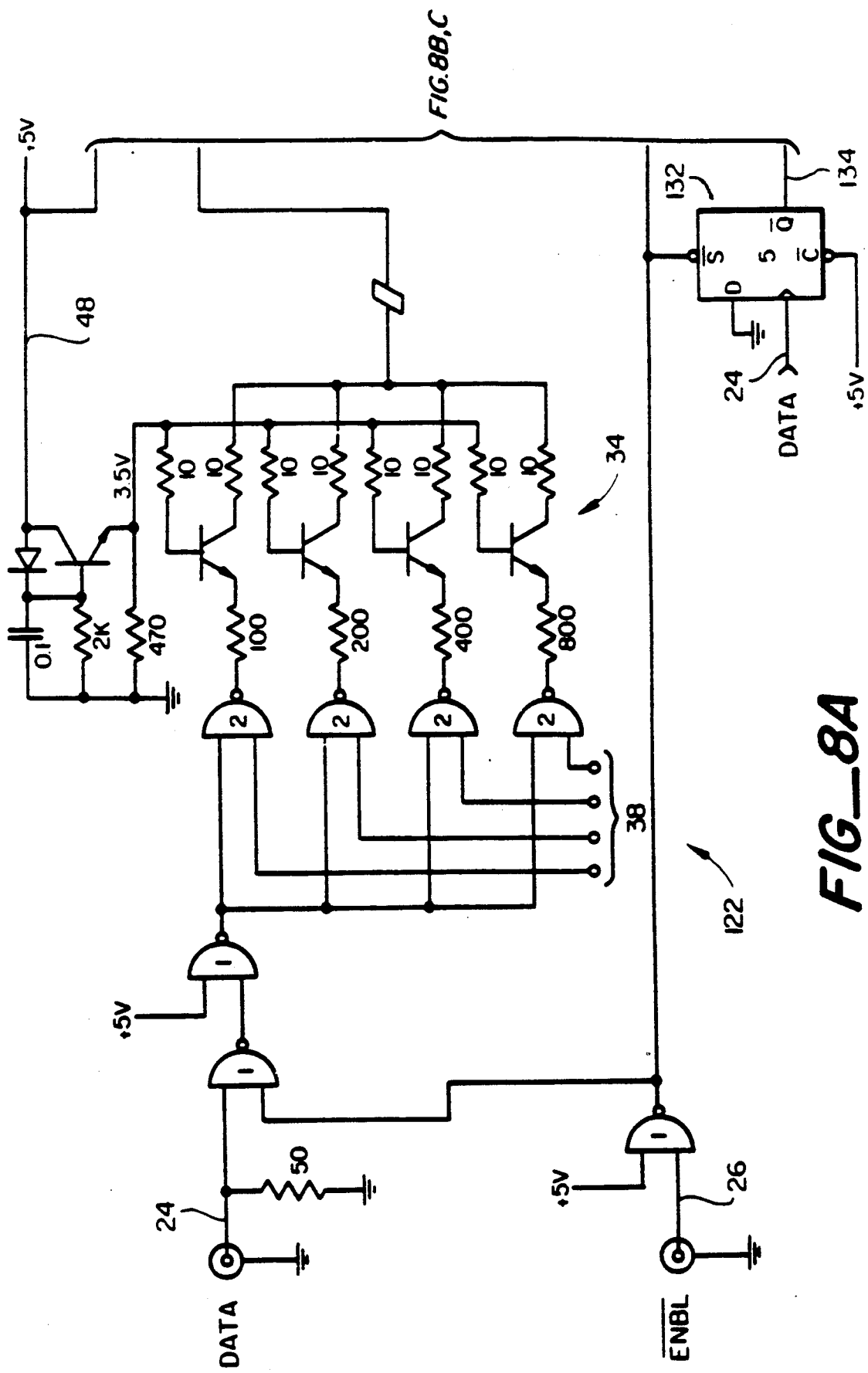
FIG_8A

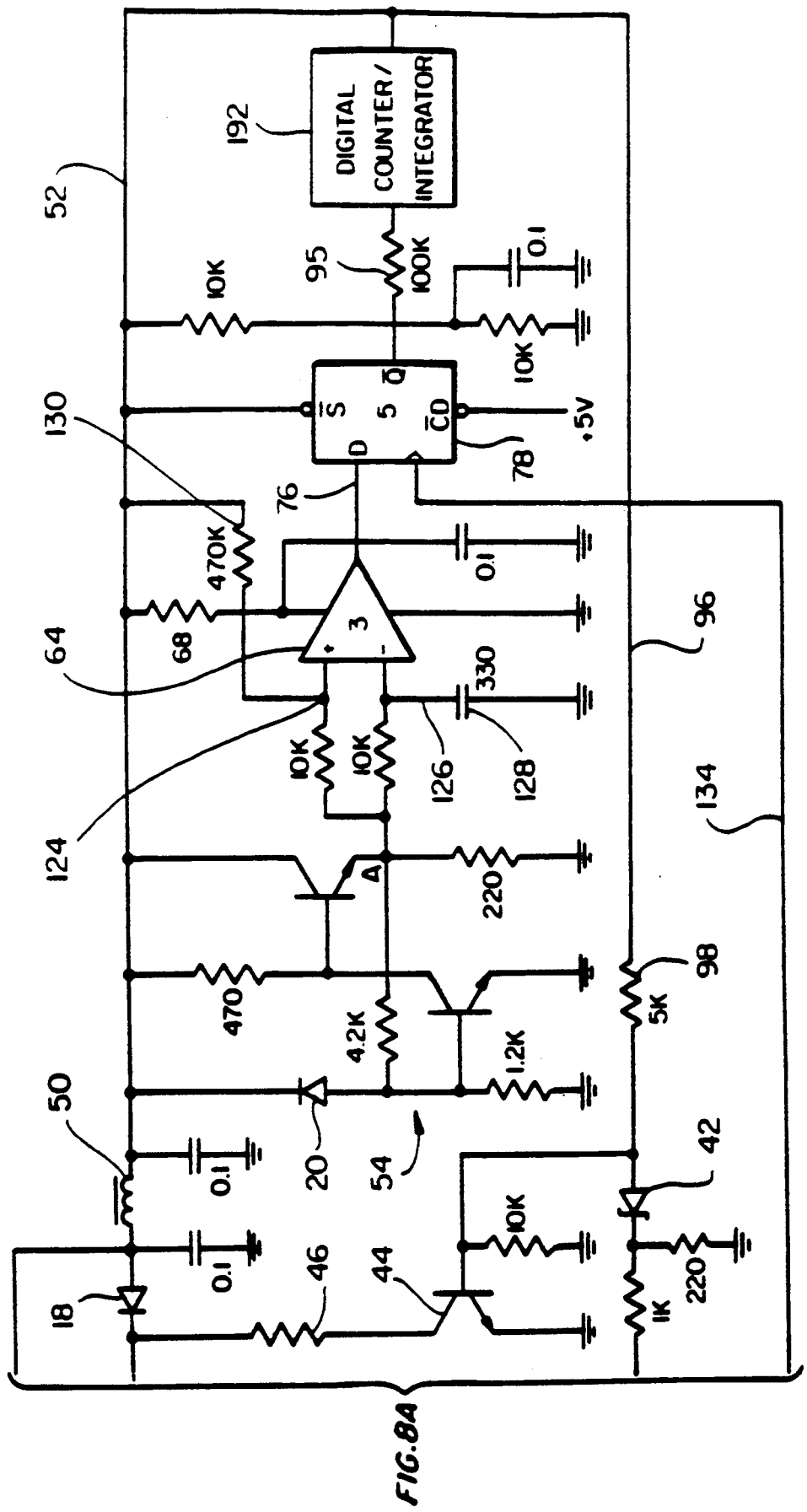
FIG_8B

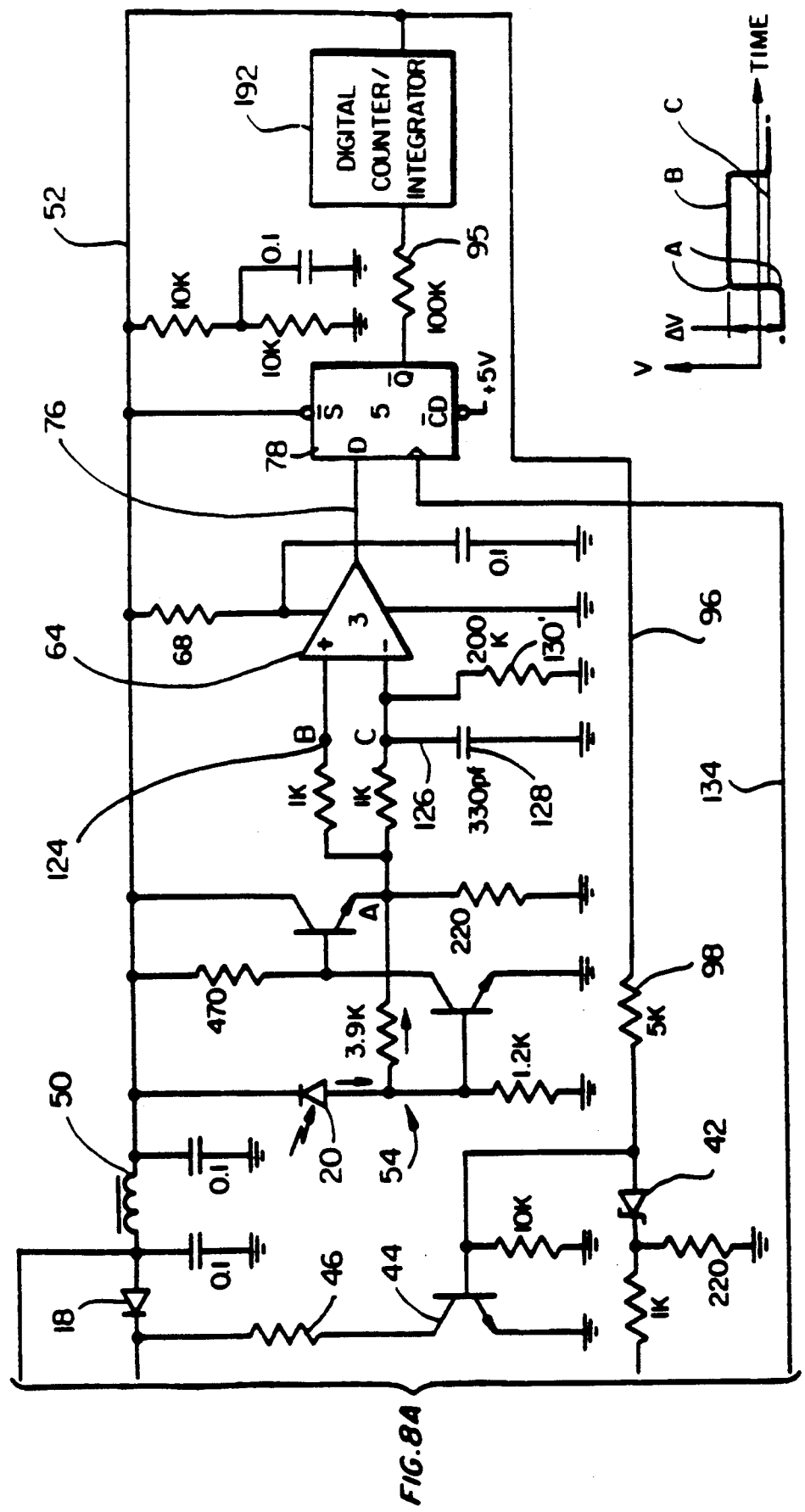

THERMAL CONTROL FOR LASER DIODE USED IN OUTSIDE PLANT COMMUNICATIONS TERMINAL

The present invention relates to control circuitry for automatically regulating optical output power of a laser diode over a thermal gradient.

Communications systems employing optical fiber cables are proliferating, due to the many advantages associated with the optical fiber medium. While optical fiber long distance trunks between central office switching points are well established, optical fiber paths have not yet been extended on a widespread basis to service subscriber locations. Central office locations provide a controlled environment for the optical transmission and reception apparatus associated with the cable. For instance, power supply levels are sufficient at the central office to provide needed heating and/or cooling to maintain temperature control of light emitting elements used in the optical communications path. While laser diodes are known to be useful for light beam communications over optical fibers, such laser diodes are not well suited for use at subscriber locations unless they are located in a house or building having a controlled temperature.

It is known that optical output power of a laser diode varies with temperature. The prior art has addressed this characteristic in several ways. One approach has been to control the environment in which the laser diode is operative. Heating and cooling devices have been employed to achieve a regulated temperature environment for the laser diode. One practical cooling mechanism for cooling a laser diode has been to employ junction devices implementing the Peltier effect at a junction of dissimilar materials. Joule heating has also been employed to provide heating to the laser diode.

One drawback of Peltier effect junctions and heating devices is that they are not efficient and typically require considerable operating power to achieve relatively modest heating and cooling effects. While laser diodes which are located at central office or head end interface units of an optical fiber communications network may be maintained within very close thermal tolerances, laser diodes of subscriber interface units remotely located from the office interface unit are typically subjected to much harsher thermal gradients, especially if located outdoors. Outdoor subscriber interface units are typically small weather-resistant enclosures which are located within about 200 feet of a subscriber's premises. Such units are typically exposed to the ambient environment. In some climates, the ambient environment may present a thermal gradient from −40 degrees Centigrade to +70 degrees Centigrade. Also, the power at each subscriber interface unit is very limited, and power is not available to provide Joule heating or Peltier cell cooling for the laser diode transmitter.

Optical fiber communications networks have typically been configured in a variety of architectures, including point-to-point, star, ring and bus. One advantage of a logical bus architecture is that it works particularly well within the conventional outside plant environment between the central office and subscriber premises.

With the logical bus architecture, time division multiplex techniques have been adopted to provide each subscriber interface unit with necessary access to the office interface unit at the central office or head end of the bus. Time division multiplex allots time slots to each of the subscriber interface units, and only one subscriber interface unit will send or receive data during its time slot in any given time frame. When laser diodes are operated only during a narrow time slot of an overall duty cycle, conventional power control techniques will not work since the laser diode is dark most of the time. Also, with subscriber interface units distributed along a logical bus, differing optical path losses require that a mechanism be provided to enable dynamic adjustment of the optical power level of each laser diode of the subscriber interface unit, so that those units most distant from the office interface unit put out the greatest optical power.

Thus, a hitherto unsolved need has arisen for a power control circuit for regulating optical power output of a laser diode operating in a time division multiplex mode and over a wide range thermal gradient.

A general object of the present invention is to provide a power control circuit and power regulation method for a laser diode operating in a time division multiplex burst mode across a thermal gradient in a manner which overcomes limitations and drawbacks of the prior art.

A more specific object of the present invention is to generate a feedback control signal based upon detection of a component of actual peak optical power output.

Another more specific object of the present invention is to generate a feedback control signal based upon detection of an optical power threshold or turn-on knee characteristic as detected during a pedestal interval occurring during a beginning of a data packet time slot.

A further more specific object of the present invention is to provide a power control circuit which establishes peak power in response to externally controlled bias level commands, and which generates a power regulation control signal based upon optical feedback from the laser diode and the particular bias level command.

One more specific object of the present invention is to provide circuitry and methods for regulating optical power of a laser diode over a remotely controllable dynamic range with circuitry which is available, inexpensive and reliable in use over a severe thermal gradient, such as from −40 degrees C to +70 degrees C.

Yet another specific object of the present invention is to provide circuitry and methods for regulating optical power of a laser diode used within outside plant communications terminal equipment, particularly equipment using a laser powered bus having a maximum voltage less than 20 V, specifically less than 15 V, optimally less than 10 V, particularly less than 8 V, more specifically less than 6 V, especially one which supplies 5 volts or less voltage.

One more specific object of the present invention is to provide an inexpensive circuit for regulating optical power of a laser diode used within outside plant communications terminal equipment and which also provides a control strobe signal which indicates to the terminal equipment and in turn to head end equipment the relative humidity at the terminal equipment.

In accordance with a facet of the present invention, a control circuit is provided for controlling the output power level of a laser diode operating periodically in a burst mode interval within a time division multiplex optical communications network. In this particular arrangement, preferably the laser diode includes a reverse facet photodetector or other circuitry for monitoring a component of the optical output power of the laser diode during each burst mode interval.

The control circuit includes a transimpedance amplifier for converting a current signal from the photodetector into an optical level voltage representative of sensed optical power during the burst mode interval; a comparator for comparing the optical level voltage with an established reference voltage and for providing a signal representing a logical condition from said comparison; a clocked storage device for storing the signal representing the logical condition upon receipt of a strobe signal; an integrator for integrating the stored logical condition over a time period to provide a control signal; a current control circuit in series with the laser diode and responsive to the control signal to regulate current flow through the laser diode; and, a strobe generator for generating the strobe signal from information related in time to the burst mode interval.

In one aspect of this facet of the invention, an optical power control circuit is provided for responding to externally supplied logical signals by controlling bias current through the laser diode during each said burst mode interval.

In another aspect of this facet of the invention, an alternating current (AC) coupling device is provided between the transimpedance amplifier and an input of the comparator, and a voltage clamp is connected to said input of the comparator for clamping the voltage at said input to approximately zero volts in the absence of an output of the optical level voltage from the transimpedance amplifier and wherein the reference voltage is adjusted to maintain optical power of the laser diode in relation to peak optical power level thereof In one more aspect of this facet of the invention, the reference voltage is established in relation to the setting of the optical power control circuit.

In yet another aspect of this facet of the invention, the control circuit receives and responds to a transmit enable control signal marking in time the boundaries of the burst mode interval and the control circuit further receives and modulates a bias current through the laser diode with digital data transitions representing communications information.

In still one more aspect of this facet of the invention, the strobe generation circuit is responsive to a transition of the transmit control signal marking the end boundary of the burst mode interval.

In yet one more aspect of this facet of the invention, the digital data transitions are presented to the laser diode after a predetermined pedestal interval, and the strobe generation circuit is responsive to the beginning of the digital data transition within the interval.

In another aspect of this facet of the invention, the transimpedance amplifier is directly coupled to an input of the comparator, and a resistor-capacitor network is connected to a voltage reference input of the comparator and to the direct coupled input of the comparator, the time constant of the resistor-capacitor network being longer than the pedestal interval thereby to supply as a dynamic reference voltage to the comparator the voltage present at the directly coupled input before the occurrence of the burst mode interval. This aspect preferably further includes a biasing circuit for presetting the state of the comparator to a known logical condition before the burst interval. In one implementation a bias resistor may apply positive preset bias to the plus input of the comparator. In another implementation, a bias resistor may apply negative preset bias to the minus input of the comparator.

In one more aspect of this facet of the invention, an optical power biasing circuit is provided for responding to externally supplied logical signals by controlling bias current through the laser diode during each burst mode interval.

In another facet of the present invention, a method is provided for controlling optical power output level of a laser diode modulated during a burst mode interval by digital data transitions within a shared bus optical communications network and over a thermal gradient. The method of this facet comprises the steps of:

optically monitoring a component of the optical output power of the laser diode during each burst mode interval and converting the component into a control signal, establishing a reference signal and comparing the control signal with the established reference signal and for providing a signal representing a logical condition from said comparison, storing the signal representing the logical condition upon receipt of a strobe signal, integrating the stored signal representing the logical condition over a time period to provide an integrated control signal, regulating current flow through the laser diode in accordance with the integrated control signal, and generating the strobe signal from information related in time to the burst mode interval.

In one aspect of this facet of the invention, a further step is provided for responding to externally supplied logical condition signals by controlling current flow through the laser diode during each said burst mode interval.

In another aspect of this facet of the invention, the step of converting the component into a control signal comprises the steps of converting the component into a current with a photodiode and translating the current into a control voltage with transimpedance amplifier means, and wherein the step of comparing the control signal with a reference signal comprises comparing the control voltage with a reference voltage.

In a further aspect of this facet of the invention, a further step is provided for coupling the control voltage to a comparator for carrying out the comparing step with an alternating current coupling and including the further step of clamping the alternating current coupled control voltage to approximately zero volts in the absence of an output of said optical component and including the further step of adjusting said reference voltage to maintain optical power of the laser diode in relation to peak optical power level thereof.

In one more aspect of this facet of the invention, the step of establishing the reference signal is carried out in relation to a further step of controlling current flow through the laser diode during each burst mode interval in response to externally supplied logical signals.

In yet another aspect of this facet of the invention, the burst mode interval is established by an eternally supplied transmit enable control signal and the digital data transitions are translated to optical output power during the interval marked by the transmit enable control signal.

In still another aspect of this facet of the invention, the step of generating the strobe is carried out in response to a transition of the transmit enable control signal marking the end boundary of the burst mode interval.

In one more aspect of this facet of the invention, the digital data transitions are presented to the laser diode after a predetermined pedestal interval within the burst mode interval, and the step of generating the strobe occurs after the pedestal interval has passed and the beginning of the digital data transition has occurred within the interval.

In still another aspect of this facet of the invention, further steps are provided for directly coupling the control signal to an input of a comparator for carrying out the comparing step and providing a signal storage device at another input of the comparator coupled to the one input and having a predetermined time constant, and wherein the time constant of the signal storage device is made longer than the pedestal interval so that the step of establishing the reference signal is carried out by supplying to the another input the signal stored in the signal storage device.

In one more aspect of this facet of the invention, a further step is provided for controlling the operating power through said laser diode in response to externally supplied logical signals.

In one more aspect of this facet of the invention, the method includes a further step of generating a signal indicative of relative humidity at the vicinity of the laser diode. In this aspect, a preferred implementation generates the signal indicative of relative humidity by by pulsewidth-modulation of the strobe signal.

These and other objects, advantages, aspects, facets and features of the present invention will be more fully understood and appreciated upon consideration of the following detailed description of the following preferred embodiments, presented in conjunction with the accompanying drawing.

FIG. 1 is a block diagram of a bus optical fiber communications network in which an office interface unit (OIU) supports a plurality of subscriber interface units (SIUs) via transmit and receive shared optical fiber paths.

FIG. 2 is a representative family of curves graphing optical power output as a function of laser current over a temperature range of −40° C. to +70° C.

FIGS. 3A and 3B represent a single schematic diagram of one presently preferred form of control circuit for controlling optical output power of a laser diode in accordance with principles of the present invention.

Figures 7A, 7B:
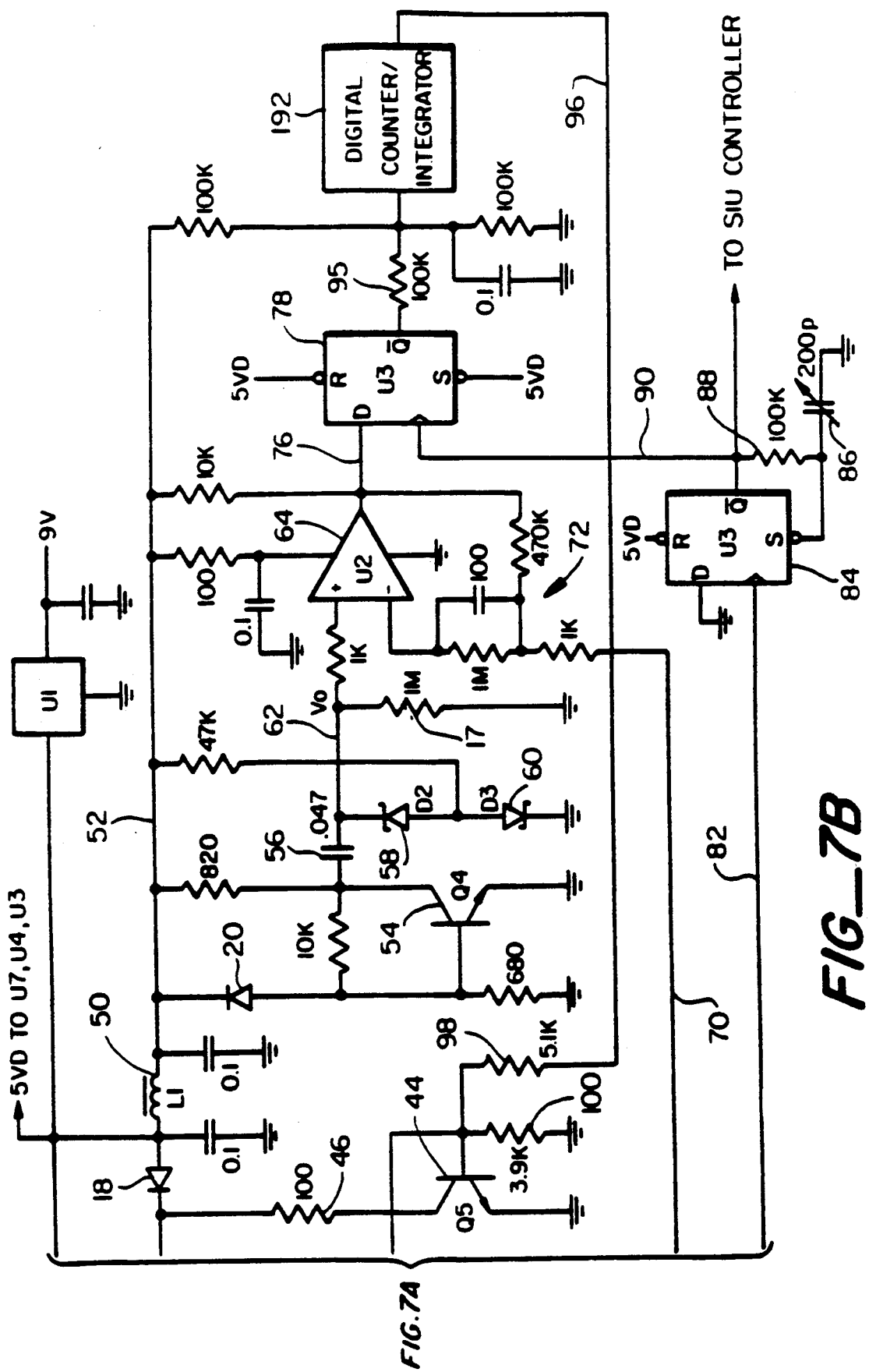

FIG. 3A forms the left half, and

FIG. 3B the right half, of the schematic diagram.

FIG. 4 is a graph of wave-forms illustrating pertinent operational characteristics of the FIG. 3 circuit.

FIGS. 5A and 5B represent a single schematic circuit diagram of another presently preferred form of control circuit for controlling optical output power of a laser diode in accordance with principles of the present invention.

FIG. 5A forms the left half, and

FIG. 5B the right half, of the schematic diagram.

FIG. 6 is a graph of wave-forms illustrating pertinent operational characteristics of the FIG. 5 circuit;

FIGS. 7A–7B and 8A–8B are similar respective to FIGS. 3A–3B and 5A–5B except for the substitution of a digital counter/integrator for the RC integrators utilized in FIGS. 3A–3B and 5A–5B, the digital counter/integrator allowing feedback control to be implemented less frequented than RC integrators.

FIG. 8C is an alternative embodiment of the comparator circuit illustrating a pull-down resistor rather than a pull-up resistor.

FIG. 8D is a waveform graph illustrating an excessive bias condition so as to illustrate one mode of operation of the FIGS. 8C and 8D circuits.

An optical fiber communications network 10 includes an office interface unit ("OIU") 12 and a plurality of subscriber interface units ("SIU") 14a, 14b . . . 14n−1, and 14n. Twenty four SIUs 14 are presently preferred. The OIU 12 communicates with each SIU 14 in its time slot via an optical fiber bus 16. A transmit fiber 16T enables the OIU 12 to transmit to each SIU 14, and a receive fiber 16R enables each SIU 14 to transmit in its turn to the OIU 12. Time division multiplexing techniques are preferably employed. For example, in one overall operational cycle or frame of 125 microseconds, each SIU 14 is allotted a time slot of about 4 microseconds with the time slots being separated by dead spacings. This means that the optical laser diode of a particular SIU 14 is on for 4 microseconds, and is off for the balance of each cycle or frame.

The OIU 12, sometimes referred to as a head-end unit, has a very sensitive receiver and a sufficiently powerful transmitter to be able to receive and send signals, preferably digital, to the most distant SIU 14n on the bus 16. The ORJ 12 and each SITJ 14 include application specific microcontrollers which communicate with each other over the optical fiber bus 16, so that the OITJ 12 can control operations at each SIU 14, and so that the status of each SIU 14 may be reported back to the OIU 12.

The OIU 12 is typically contained in a controlled environment, such as a central office switching center, or other call concentration and forwarding location of a telecommunications network, while each SIU 14 is part of an outside plant installation and is located ideally not more than about 200 feet from each subscriber's premises. Wire pairs or coaxial cable extend from the SIU 14 to the subscriber's premises to provide telecommunications service access to the subscriber. A single SIU 14 may accommodate a number of subscriber service lines. While the OIU 12 is located in an environment in which the power supply is not an issue, and where temperature of transmit laser diodes may be carefully regulated by conventional means, each SIU located in the outside plant has a very limited power supply. Conventional temperature compensation techniques for a laser diode transmitter at the SIU 14 are not available.

FIG. 2 presents a family of characteristic curves for a laser diode 18 of the type employed in each SIU 14. The laser diode 18 (FIG. 3) may be a type FU-11SLD-N made by Mitsubishi, or equivalent. The laser diode 18 has a forward direction optical facet, and has a reverse facet in proximity with a photodiode 20 which enables indirect sensing of the optical power put out in the forward direction. Light energy at the reverse facet closely approximates the light energy at the forward facet.

According to FIG. 2, the current passing through the laser diode, for a given optical power, varies considerably with temperature. The leftmost curve represents the current vs. optical power output at a diode temperature of −40° C., while the rightmost curve represents laser current vs. optical power output at the other temperature extreme, such as +70° C. At the lowest temperature the laser diode 18 manifests a turn-on threshold or knee at approximately 5 milliamperes, whereas at the highest temperature, the turn-on current is about 30 milliamperes. Since the SIU 14 (and its laser diode 18) is located in the external ambient, in some climates the temperature range shown in FIG. 2 may be present as the seasons change.

Turning now to FIGS. 3A-3B, a control circuit 22 is provided for controlling two aspects of the operation of the laser diode 18. The first control aspect is one for adjusting dynamically the power output level, so that the OIU 12 can command that the power level be increased for more distantly located SIUs 14 and reduced for the SIUs located nearby. The second control aspect is one which tracks and compensates for variations in optical output otherwise caused by various variables, particularly temperature changes. The implementation of these two control aspects will now be considered.

Digital data (BAR TxD) enters the circuit 22 on a line 24 and a time slot control signal (BAR TxEN) enters the circuit on a line 26. The digital data passes through gates 28, 30 and 32 to a subcircuit 34 which enables the power level of the laser diode 18 to be set dynamically, e.g. the first control aspect. Ultimately, the data signal BAR TxD is combined with a bias current from control transistor 44 and appears at a node 36 leading to the cathode of the laser diode 18. The power level set by the subcircuit 34 is set by digital values supplied over a control bus 38 from an ASIC controller (not shown) included within the SIU 14. The SIU controller establishes the power level at the SIU in accordance with instructions it receives from its counterpart at the OIU 12.

The time slot control signal BAR TxEN passes through a gate 40 and through one input of the AND gate 30 to block the data signal BAR TxD except during the time that the time slot control signal is active. Simultaneously, the time slot control signal passes through a Schottky junction diode 42 to the control transistor 44 in series with a resistor 46 and the cathode of the laser diode 18. The transistor 44 provides a proportional adjustment of bias current for the laser diode and acts to control the bias current over a wide, temperature range in accordance with a further control signal, the generation of which will be explained hereinafter, e.g. the second control aspect. The anode of the laser diode 18 leads to a +5 volt digital electrical power bus 48. A choke 50 also connects to the bus 48 and separates the digital side thereof from an analog side 52 thereof. Filter capacitors are on both the digital and analog sides of the +5 volt supply bus. The reverse facet photodetector diode 20 is connected to a transimpedance amplifier 54 which converts the current developed through the diode 20 into a voltage which is proportional to the instantaneous peak optical power output of the laser diode 18 which is detected during the time slot fixed by the time slot control signal BAR TxEN. The proportional voltage put out by the amplifier 54 leads through a coupling capacitor 56 to a node 62 to which two reverse-connected Schottky diodes 58 and 60 which are biased to clamp the node 62 (at roughly zero volts) during the peak negative excursion of a signal passing through the capacitor 56. The node 62 provides one input (Vo) to a comparator 64. More specifically, the capacitor 56 and diodes 58, 60 function to clamp onto the peak negative voltage generated by the diode 20 throughout the time slot, which peak voltage Vo is inputted into the comparator 64 via the node 62. During a dark period of the frame, the voltage Vo is drained by resistor 17.

A predetermined reference voltage is provided at the other input to the comparator 64 from a potentiometer 66 which permits adjustment of the regulated power output of the laser diode 18. The wiper of the potentiometer 66 leads through an operational amplifier 68 which puts out a VREF signal on a line 70 leading to a resistor-capacitor parallel network at the reference voltage input of the comparator 64. An output node 76 of the comparator 64 provides a binary value indicating whether the voltage, Vo, on the node 62 is above or below the reference voltage VREF on the line 70. The binary value is then strobed into a latch 78 in accordance with a clocking signal developed from the rising edge of the time slot control signal BAR TxEN (FIG. 4). Its rising edge clocking signal passes through the gate 40 and a gate 80 to maintain its original logical condition as an inverted control signal. The gate 80 leads via a line 82 to a clocking input of a flip-flop 84 configured as a one shot. The duration of the pulse put out by the flip-flop 84 over a clock line 90 is established by the time constant of a series RC network including a capacitor 86 and a resistor 88.

Advantageously, the capacitor 86 is one having a characteristic which varies in a known way with changes in relative humidity. Thus, the width (w) (FIG. 4) of the clocking pulse put out on the line 90 is related to the relative humidity within the SIU 14. If excess moisture intrudes into the interior space of the SIU 14, the width of the clocking pulse on the line 90 will change. The pulse width of this signal is monitored by the ASIC controller of the SIU 14, and if it exceeds a predetermined acceptable range, a warning signal is sent by the controller to the OIU 12 so that an alarm may be generated and service personnel dispatched to the particular SIU. The dotted line 53 in FIG. 4 represents an alternative possible width of the clocking pulse, the actual width (w) encountered in practice depending on the humidity as sensed by the capacitor 86, as explained.

The clocking signal on the line 90 clocks the binary value into the latch 78. An inverted output of the latch 78 leads to an input of an operational amplifier 92 configured as an integrator by virtue of a feedback capacitor 94. An output line 96 from the integrator 92 leads through a series resistor 98 to the base of the control transistor 44. Another resistor 100 also connects the base of the control transistor 44 to ground. The signal on the line 96 controls the amount of current passing through the transistor 44 and in turn the amount of current passing through the laser diode 18.

It should be noted that the voltage appearing across the power adjustment potentiometer 66 is dynamically adjusted to track the power setting commanded by the OIU over the control bus 38. To this end, a gate 102 and resistor 104 provide an adjustment when one bit line of the bus 38 is enabled. Similarly, a gate 106 and a resistor 108 make a further dynamic adjustment when another bit line of the bus 38 is enabled. The resistors 104 and 108 are within a voltage divider network leading from the analog +5 volt bus 52 and also including series resistors 110 and 112 leading to the potentiometer 66.

Operation of the circuit 22 win now be explained in conjunction o with FIG. 4. Therein in graph A the time slot control signal BAR TxEN is shown to be a negative going pulse of approximately four microseconds duration within an overall recurrent operational cycle or frame of 125 microseconds, for example. The particular SIU 14 is only able to transmit during its 4 microsecond time slot in the overall cycle. In graph B the BAR TxD data signal, more specifically node 62 and Vo, is shown for two BAR TxEN time slots. In the left time slot data burst, the peak negative excursion is shown to be less than a value fixed by the VREF value on the line 70. When the peak negative exclusion is converted to a voltage and compared with VREF in the comparator 64, the binary output is a logical HIGH. At the clock time, which coincides with the rising edge of the BAR TxEN time slot control signal (at the end of this pulse), the logical HIGH binary value is strobed into the flip-flop 78, and its inverted output is then LOW for the remainder of the 125 microsecond overall operational cycle. This logical LOW value causes the integrator 94 to increase the voltage level on the line 96 during the remainder of the operational cycle, with the rate of increase fixed by the time constant formed by the integration feedback capacitor 94 and a low value series resistor 95. The increasing voltage is presented to the control transistor 44, and during the next BAR TxEN time slot, more current will flow through the control transistor 44, and more current will consequently flow through the laser diode 18.

At the right side of Graph B of FIG. 4, the peak amplitude of optical power put out by the laser 18 is greater than the VREF value. In this situation, the opposite condition results at the output of the comparator 64, and a LOW level is latched into the flip-flop 78 by the strobe pulse on the line 90. The inverted output of the flip-flop 78 is now HIGH, causing the integrator 94 to lower the voltage put out on the line 96 leading back to the base of the control transistor 44.

During operation of the circuit 22, the binary value put out by the comparator 64 will dither about the VREF setpoint, which is preset to be at the desired maximum peak optical power output level for the particular laser diode 18. As the temperature changes, the binary value put out by the comparator will correspond to the direction of temperature change, and either successively raise or lower the base voltage to the transistor so that the peak negative excursion continues to dither about the VREF setpoint. Since the circuit 22 monitors peak optical power output of the laser diode 18, and dynamically corrects that power output level, it remains substantially constant over a very wide temperature range and compensates for other variables as well, such as laser diode aging.

Graph C of FIG. 4 illustrates the strobe pulse on the line 90 as being of variable duration, based on the humidity within the SIU as sensed by the capacitor 86. As humidity varies, pulse width varies as designated by the dashed lines in Graph C of FIG. 4. Advantageously, the flip-flop 78 is edge-triggered, and is therefore insensitive to actual duration of the pulse, whereas the duration may be counted by a counter of the ASIC controller of the SIU and used to indicate an alarm if excessive moisture collects or is present within the housing of the SIU 14.

While the circuit 22 of FIGS. 3A-3B operates very satisfactorily to detect peak optical power output from the laser diode 18 during the time slot when fight energy is being detected by the photodetector diode 20 and thereby regulate optical power over thermal gradient, the circuit 22 has some slight drawbacks.

For one thing, the circuit measures and controls the peak optical power by controlling the DC bias current in the laser. The precise DC operating point of the laser is not accurately determined. Therefore, because of the extreme nonlinear nature of the laser characteristics as shown in FIG. 2, the range of the programmable optical power is limited to about 6 dB in a practical case. Furthermore, the analog voltage bus is limited to +5 volts because of power constraints at the remotely situated SIU 14. The +5 volt bus effectively limits the linear range of the integrator 94 to about 1.5 volts which has the consequence of limiting the dynamic range of the circuit 22. If a 10 dB adjustment range were desired, such as one volt to 100 millivolts at the lower level the diodes 58 and 60 are inoperative to clamp the node 62.

The circuit 122 in FIGS. 5A-5B operates upon the same premise of permitting the laser diode 18 to operate in accordance with its particular characteristics over the thermal gradient, but tracks optical power differently. The FIG. 5A-5B circuit monitors the turn-on knee of the laser diode and sets the dynamic range from that point, rather than from maximum peak power as is done with the circuit 22 thereby insuring that the laser operates in the linear region. In the circuit 122 like reference numerals are used for elements that correspond generally with like elements in the circuit 22, while different numerals are given to those elements of the FIG. 5A-5B circuit 122 which differ from the FIG. 3A-3B circuit 22.

The FIG. 5A-5B circuit 122 detects the location of the turn-on threshold or knee of the optical laser diode 18 over the operating temperature range. As noted, this approach has some advantage over the circuit 22 by providing a greater dynamic range for commanding optical power output levels. Whereas about 6 dB of power tuning is available with the circuit 22 using a +5 V bus, the circuit 122 provides a power tuning control bus 38 having a greater power tuning range above the turn-on knee of the characteristic curve at a particular ambient operating temperature.

In the circuit 122, the BAR TxEN signal is generated slightly ahead of the beginning of data. For example, FIG. 6 shows the BAR TxEN burst enable signal having a failing edge at t1, and the beginning of the data burst BAR TxD occurring at a later time t2. According to a preferred embodiment, time t2 occurs about 400 nanoseconds after time t1. When the BAR TxEN signal goes LOW, the diode 42 becomes reverse biased, and the laser diode 18 begins to lase at its turn-on knee of its characteristic curve. Since data is not yet present, the photodiode 20 puts out what amounts to a pedestal current above the diode dark current level.

The transimpedance amplifier 54 changes the dark current to a voltage 123 and the pedestal current to a lower pedestal voltage 124, as graphed in FIG. 6E. The pedestal voltage 124 is supplied to the non-inverting input of the comparator, while a predetermined reference voltage 126 held by a storage capacitor 128 is supplied to the inverting input of the comparator 64.

A resistor 130 from the +5 volt analog bus 52 and the bias current flowing through the transimpedance amplifier 54 present a nominal voltage to the non-inverting input of the comparator 64 such as about 3 volts in the absence of a change in voltage from the transimpedance amplifier 54 due to the pedestal 124. Since the inverting input is also connected to this input bias point, the same dark current voltage is present to the inverting input after the capacitor 128 charges. The dark current voltage present at the inverting input, e.g. node 126, corresponds to a predetermined reference voltage which establishes the desired point for the turn-on knee for the laser diode.

When the BAR TxEN signal goes LOW, the dark current voltage 123 falls rapidly (e.g. within about 400 nsec) to the pedestal voltage 124 as supplied to the non-inverting input of the comparator whereas the dark current voltage 126 supplied to the inverting input is held by the capacitor 128 and thereby becomes a dynamic reference voltage. Accordingly, if the comparator is strobed about 400 nsec after the failing edge of the BAR TxEN signal, a comparison of the voltages at nodes 124 and 126 results in the comparator 64 and flip flop 78. If the strobed pedestal voltage 124 is below the voltage present at the inverting input of node 126 as held by the capacitor 128, the output of the comparator 64 is LOW (indicating too much light), and this causes the latch 78 to put out a LOW logic level at its BAR Q output to the integrator 92. The integrator 92 then ramps down the control voltage on the line 96 to adjust the bias on the control transistor 44 and cause the pedestal current in the laser diode to increase. If the pedestal voltage 124 is above the reference voltage 126 as held by the capacitor 128, the integrator 92 ramps up the pedestal current of the laser diode 18.

The logical value put out by the comparator 64 is latched into the flip-flop 78 at the beginning of the data burst at time t2. A flip-flop 132 is clocked by the leading edge of the data burst, and it is reset by the falling edge of a TxEN control signal (FIG. 6B) which is an inversion of the incoming BAR TxEN control signal at the input 26. The flip-flop 132 puts out a strobe pulse over a control line 134 leading to the flip-flop 78. The capacitor 128 forms an RC network having a time constant in microseconds, rather than nanoseconds, and so is effective to maintain the voltage at the inverting input of the comparator at approximately the same value during the t1 to t2 400 nanosecond interval when data arrives and the comparator logical output level is strobed into the flip-flop 78.

In practice the integrator 92 ramps the pedestal current up or down in the frame succeeding the frame when the time slot is strobed so that this feedback information is utilized in a time slot following the relatively short strobed time slot.

The embodiments of FIGS. 3A-3B and 5A-5B operate to adjust a data signal voltage, e.g. either a peak voltage or a pedestal voltage, in a time slot in a time frame subsequent to the actual time slot wherein comparison to a reference voltage is made. This has the advantage of not requiring ultrahigh speed electronics which is required if a comparison and integration function is desired in the same time slot that the comparison occurs. According to both the embodiments of FIGS. 3A-3B and 5A-5B, the comparison is made for each data packet and hence for each frame in which data is sent. In the FIG. 5A-5B embodiment, this has a disadvantage in that it consumes a predetermined amount of overhead since the pedestal is measured during the data transmission packet time during a period, in the embodiment specified 400 nsec, in which actual data cannot be sent. Since the circuit is intended to simply adjust the o pedestal current so as to dither about a reference pedestal current, and since temperature changes and laser diode aging occur relatively slow, it is apparent that an output from the integrator 92 does not have to be utilized for each and every data packet, which in the case of telephone voice signals occurs 8000 times a second. Accordingly, as illustrated in FIGS. 7A-7B and 8A-8B, the integrator 92 could be replaced with a digital counter/integrator 192 which could hold the output from the comparator 64 and latch 78 for a predetermined period of tune, for example one superframe which corresponds to 24 frames, so as to decrease the amount of overhead associated with the circuit of the invention. Accordingly, it will be appreciated that one need only determine the maximum expected temperature change over time and the amount of voltage increment to be generated by the digital counter/integrator 192 so as to determine an optimum or minimum repetition frequency for sampling an output of the laser diode 18 so as to generate the requisite feedback control so that the laser diode 18 is functional as intended over the desired ambient operating temperature range.

With reference to FIG. 8C, node A represents a voltage which can vary over a limited range such as 1-3 volts, for example. Node B at the positive input of the comparator 64 represents an instantaneous level which follows the level at node A without any inertia. Node C at the negative input of the comparator 64 represents a reference level which floats very closely to the level appearing at node A, but is subject to a time constant established by the capacitor 128 and the 1 K resistor and the 220 ohm resistor. As shown in FIG. 8D, the voltage at node B represents a real time delta or change value occurring at node A. The condition graphed in FIG. 8D is one in which the output of the comparator 64 will become positive, and will result in a negative or decrement logical condition being put out by the latch 78 to the counter 192.

If node A, and node B go above the level at node C by some amount, denoted as delta V in FIG. 8D, during the illumination interval when the laser diode 18 is operating, this condition means that too much bias current is being supplied to the laser diode 18, and the counter 192 will be decremented as a result of this condition. However, if the delta V voltage does not go above the level A, there is insufficient bias being supplied to the laser diode 18, and the counter 192 is incremented for this burst interval.

Node A represents a very low impedance and operates at a quiescent point of about 3.5 volts. When light is detected in the reverse facet diode 20, current flows through the 3.9 K resistor and is amplified by the transistor Darlington pair, causing t%e voltage at node A to come down slightly. In the circuit example given in FIG. 8B, the resistor 130 provides a slight positive bias to the positive input of the comparator 64 (node B). In the circuit example given in FIG. 8C, the resistor 130' provides a slight negative bias to the negative input of the comparator 64 (node C). Thus, the resistors 130, 130' operate to preset the logical state of the comparator 64 and establish the delta V step height occurring during the burst interval. The negative bias provided by the resistor 130' (FIG. 8C) provides a simpler, more convenient arrangement with slightly improved dynamic range than the circuit shown in FIG. 8B. Both circuits work well.

To those skilled in the art to which the present invention pertains many widely differing embodiments will be suggested by the foregoing without departing from the spirit and scope of the present invention. The descriptions and disclosures herein are intended solely for purposes of illustration and should not be construed as limiting the scope of the present invention which is more particularly pointed out by the following claims.

What is claimed is:

1. A circuit for controlling an output power level of a laser diode operating over a thermal gradient, said laser diode emitting optical energy at a remotely commanded optical power level periodically in a burst mode interval of a recurrent frame within a time division multiplex optical communications network, comprising:

monitoring means for monitoring a peak output optical power of the laser diode during a said burst mode interval thereof, transimpedance amplifier means for converting a current signal from the monitoring means into a peak optical level voltage representative of sensed peak optical power during the burst mode interval, comparator means for comparing the peak optical level voltage with a reference voltage derived in response to remotely commanded optical output level and for providing a signal representative of a logical condition from said comparison, adjusting means for adjusting the peak optical power based on the signal and the remotely commanded optical output level.

2. A circuit for controlling the output power level of a digital data modulated laser diode operating periodically in a burst mode interval of a recurrent frame within a time division multiplex optical communications network, comprising:

enabling means for generating a transmit enable signal denoting a beginning boundary of the burst mode interval;

monitoring means for monitoring an output optical power of a LOW pedestal signal of the laser diode during a beginning portion of the burst mode when digital data modulation is not being sent by the laser diode;

transimpedance amplifier means for converting a current signal from the monitoring means into an optical level voltage representative of sensed optical power during the beginning portion of the burst mode interval, comparator means for comparing a maximum value of the optical level voltage with a dynamic reference voltage and for providing a signal representative of a logical condition from said comparison, adjusting means for adjusting the pedestal signal based on a value of the signal.

3. The circuit of claim 2, the adjusting means comprising:

strobe generation means for generating a strobe signal from information related in time to the burst mode interval;

clocked storage means for storing the signal representative of the logical condition upon receipt of the strobe signal so as to provide a control signal;

current control means in series with the laser diode and responsive to the control signal to regulate current flow through the laser diode;

the strobe generation means generating the strobe signal in a transmit enable time interval prior to transmitting digital data, the current control means adjusting the current flow through the laser in response to the control signal in a subsequent transmit enable time interval;

the clock storage means including an integrator means for integrating the stored logical condition over a time period to provide the control signal;

the integrator means including at least one of a digital counter and an RC circuit; and the adjusting means including a digital counter whereby the signal representative of the logical condition used for adjusting the LOW pedestal signal is generated less frequently than once a frame.

4. The circuit set forth in claim 2 wherein the current control means increases the current flow through the laser diode when the pedestal voltage is less than the dynamic reference voltage and decreases the current flow through the laser diode when the dynamic LOW pedestal signal is greater than the reference voltage.

5. The circuit set forth in claim 2 further comprising power tuning optical power control means for responding to externally supplied logical signals by controlling bias current through said laser diode during each said burst mode interval.

6. The circuit set forth in claim 2 wherein the digital data transitions are presented to the laser diode after a predetermined pedestal interval, and the strobe generation means is responsive to the beginning of the digital data transition within the interval, the transimpedance amplifier means being directly coupled to an input of the comparator means, and further comprising a resistor-capacitor network means connected to a voltage reference input of the comparator means and to the direct coupled input of the comparator means, the time constant of the resistor-capacitor network being longer than the pedestal interval thereby to supply as the dynamic reference voltage to the comparator means the voltage present at the directly coupled input before the occurrence of the digital data.

7. The circuit set forth in claim 6 further comprising bias resistor means for presetting the logical condition of the comparator means.

8. A circuit for controlling the output power level of a digital data modulated laser diode operating periodically in a burst mode interval of a recurrent frame within a time division multiplex optical communications network, the laser diode including a reverse facet photodetector for monitoring the optical output power of the laser diode during each burst mode interval, the circuit comprising:

transimpedance amplifier means for converting a current signal from the photodetector into an optical level voltage representative of sensed optical power during the burst mode interval, comparator means for comparing the optical level voltage with a dynamic reference voltage and for providing a signal representative of a logical condition from said comparison, clocked storage means for storing the signal representative of the logical condition upon receipt of a strobe signal, integrator means for integrating the stored signal representative of the logical condition over a time period to provide a control signal, current control means in series with the laser diode and responsive to the control signal to regulate current flow through the laser diode, and strobe generation means for generating the strobe signal from information related in time to the burst mode interval.

9. The circuit set forth in claim 8 wherein the current control means further comprises optical power control means for responding to externally supplied logical signals by controlling bias current through said laser diode during each said burst mode interval and further comprising dynamic reference voltage generating means for generating the dynamic reference voltage in function of the externally supplied logical signals and applying the dynamic reference voltage to the comparator means.

10. The circuit set forth in claim 8 wherein the circuit receives and responds to a transmit enable control signal marking in time the boundaries of the burst mode interval and wherein the circuit receives and modulates a bias current through the laser diode with digital data transitions representing communications information.

11. The circuit set forth in claim 10 wherein the strobe generation means is responsive to a transition of the transmit control signal marking the end boundary of the burst mode interval.

12. The circuit set forth in claim 10 wherein the digital data transitions are presented to the laser diode after a predetermined pedestal interval, and the strobe generation means is responsive to the beginning of the digital data modulation within the interval.

13. The circuit set forth in claim 12 wherein the transimpedance amplifier means is directly coupled to an input of the comparator means, and further comprising a resistor-capacitor network means connected to a voltage reference input of the comparator means and to the direct coupled input of the comparator means, the time constant of the resistor-capacitor network being longer than the pedestal interval thereby to supply as the reference voltage to the comparator means the voltage present at the directly coupled input before the occurrence of the burst mode interval.

14. The circuit set forth in claim 12 wherein the current control means further comprises optical power control means for responding to externally supplied logical signals by controlling bias current through said laser diode during each said burst mode interval.

15. A method for controlling optical power output level of a laser diode modulated during a burst mode interval by digital data transitions within a logical bus optical communications network and over a thermal gradient, the method comprising the steps of:
  optically monitoring a component of the optical output power of the laser diode during each burst mode interval and converting the component into a control signal,
  generating a dynamic reference signal and comparing the control signal with the dynamic reference signal and providing a signal representative of a logical condition from said comparison,
  storing the signal representative of the logical condition upon receipt of a strobe signal,
  regulating current flow through the laser diode in accordance with the integrated control signal.

16. The method set forth in claim 15 wherein the step of converting the component into a control signal comprises the steps of converting the component into a current with a photodiode and translating the current into a control voltage with transimpedance amplifier means, and wherein the step of comparing the control signal with a dynamic reference signal comprises comparing the control voltage with a dynamic reference voltage.

17. The method set forth in claim 15, wherein the dynamic reference voltage is dynamically established during operation of the optical communications network in function of at least one of externally supplied optical power level control signals and internally generated reference voltages related to dynamic detection of low pedestal knee characteristics of the laser diode across said thermal gradient.

* * * * *

UNITED STATES PATENT AND TRADEMARK OFFICE
CERTIFICATE OF CORRECTION

PATENT NO. : 5,319,656
DATED : Geller, William L.
INVENTOR(S) : June 7, 1994

It is certified that error appears in the above-indentified patent and that said Letters Patent is hereby corrected as shown below:

Column 6, line 27, replace "ORJ" by --OIU--.

Column 6, line 27, replace "SITJ" by --SIU--.

Column 6, line 30, replace "OITJ" by --OIU--.

Column 8, line 62, replace "win" by --will--.

Column 8, line 63, delete "o".

Column 8, line 66, replace "overail" by --overall--.

Column 9, line 61, replace "fight" by --light--.

Column 10, line 40, replace "failing" by --falling--.

Column 11, line 8, replace "failing" by --falling--.

Column 11, line 59, delete "o".

Column 12, line 2, replace "tune" by --time--.

Column 12, line 44, replace "t%e" by --the--.

Signed and Sealed this

Twenty-seventh Day of September, 1994

Attest:

BRUCE LEHMAN

Attesting Officer          Commissioner of Patents and Trademarks